United States Patent [19]

Butler

[11] Patent Number: 4,742,499

[45] Date of Patent: May 3, 1988

[54] FLEXTENSIONAL TRANSDUCER

[75] Inventor: John L. Butler, Marshfield, Mass.

[73] Assignee: Image Acoustics, Inc., N. Marshfield, Mass.

[21] Appl. No.: 873,961

[22] Filed: Jun. 13, 1986

[51] Int. Cl.[4] ..................... H01L 41/06; H01L 41/04; H04R 17/00; H04R 15/00

[52] U.S. Cl. .................................... 367/155; 367/156; 367/165; 367/168; 310/26; 310/334; 310/337; 381/190; 318/118; 73/DIG. 2

[58] Field of Search ........................ 367/153, 155–157, 367/160, 161, 165, 166, 168, 171, 173, 175, 180, 188, 167, 172, 163; 310/26, 330–332, 337, 324; 318/118; 179/110 A, 110 C; 381/190; 73/DIG. 2

[56] References Cited

U.S. PATENT DOCUMENTS

| | | | |
|---|---|---|---|
| 2,064,911 | 12/1936 | Hayes | 367/156 |
| 3,160,769 | 12/1964 | Abbott | 310/26 |
| 3,258,738 | 6/1966 | Merchant | 367/158 X |
| 3,277,433 | 10/1966 | Toulis | 367/155 |
| 4,072,871 | 2/1978 | Wilson | 367/155 X |
| 4,384,351 | 5/1983 | Pagliarini, Jr. et al. | 367/168 X |
| 4,432,080 | 2/1984 | Wardle | 367/163 |
| 4,443,731 | 4/1984 | Butler et al. | 310/26 X |

*Primary Examiner*—Deborah L. Kyle
*Assistant Examiner*—Brian S. Steinberger
*Attorney, Agent, or Firm*—Wolf, Greenfield & Sacks

[57] ABSTRACT

An acoustic transducer for providing large displacements particularly at low acoustic frequencies is formed from a minimum of three curved shells which are attached to each other at their ends. The shells are driven by a ring or corresponding number of attached piezoelectric or magnetostrictive type rod or bar drivers which take the form of a regular polygon. The curved shells are attached to the ends of the driver and vibrate with magnified motion as the rods execute extensional motion. As the polygon expands the curved shells deform and produce additional motional in the same radial direction resulting in a large total displacement and corresponding large acoustic output.

20 Claims, 4 Drawing Sheets

FLEXTENSIONAL TRANSDUCER

BACKGROUND OF THE INVENTION

The present invention relates in general to an acoustic transducer and pertains, more particularly, to a flextensional polygon transducer which, inter alia, provides large displacements at low acoustic frequencies.

A number of so-called flextensional transducer designs have evolved based on the patents of W. J. Toulis, U.S. Pat. No. 3,277,433, "Flexural-Extensional Electromechanical Transducer", Oct. 4, 1966 and H. C. Merchant, U.S. Pat. No. 3,258,738, "Underwater Transducer Apparatus", June 28, 1966. In the invention of Toulis an oval-shaped cylindrical shell is driven along its major axis by a stack of piezoelectric bars resulting in a magnified motion of the shell in the minor axis as driven by the piezoelectric stack. The motions are opposite in phase and the magnification is approximately equal to the ratio of the major to minor axis if the shell is in the shape of an ellipse. In the H. C. Merchant invention the shell is curved inward in a concave way so that the motion along the major axis and the ends is in phase with the motion in the direction of the minor axis.

These prior art patents are limited to a transduction in which four orthogonal surfaces are in motion. In one case all four move in phase while in the other case the orthogonal motions are out of phase. In neither case are the directions of major motion in the same direction as the motion of the transduction mechanism. In both of these prior patents the direction of the magnified motion is in a direction which is orthogonal to the driver direction. Moreover, only two major surfaces produce the large motion which may result in directional acoustic radiation at frequencies higher than the fundamental shell system resonance. Also, since the driver mechanism is very stiff compared to the shell the resonance of the driver is much higher than that of the shell making it difficult to design the system with a coupled resonance. In the case of the above two patents the driver stack is operated as a stiff spring attached to the two ends of the shell along the major axis. On the other hand the invention disclosed herein overcomes these limitations and adds a new degree of motion which is in the same general direction as the shell motion.

SUMMARY OF THE INVENTION

Accordingly, it is an object of the present invention to provide an improved flextensional transducer that is characterized by improved shell motion for a given drive.

Another object of the present invention is to provide an improved flextensional transducer including a piezoelectric or magnetostrictive drive mechanism in which motion is magnified by a flextensional induced bending motion which is in the same general direction of the major motion of the transduction driver thus resulting in an additive motion.

A further object of the present invention is to provide an improve flextensional transducer in which the same transducer shell may be in a form circumscribed by a triangle or higher order regular polygon such as an octagon or a simple square.

To accomplish the foregoing and other objects features and advantages of the invention there is provided an acoustic transducer and more particularly a flextensional polygon transducer which is adapted to provide large displacements at low acoustic frequencies. The transducer of the invention comprises a minimum of three curved shells which are attached to each other at their ends. The shells are driven by a ring or corresponding number of attached piezoelectric or magnetostrictive type rod or bar drivers which together take on the form of a regular polygon. The curved shells are attached to the ends of the drivers and vibrate with a magnified motion as the rods execute extensional motion. As the polygon expands the curved shells deform and produce additional motion in the same radial direction resulting in a large total displacement and corresponding large acoustic output. The resonance of the polygon or ring transducer and the curved shells may be adjusted for broad band operation and extended low frequency performance. Because of the near ring or cylindrical shape of the shell structure, the beam pattern is nearly omnidirectional in the plane of the ring.

BRIEF DESCRIPTION OF THE DRAWINGS

Numerous other objects features and advantages of the invention should now become apparent upon a reading of the following detailed description taken in conjunction with the accompanying drawings, in which.

DETAILED DESCRIPTION

The present invention relates to a transduction device in which either pizeoelectric or magnetostrictive mechanisms provide motion that is magnified by a flextensional (flexural-extensional) induced bending motion which is also in the same general direction of the major motion of the transduction driver thus resulting in an additive motion. The shell may be in a form circumscribed by a triangle or higher order regular polygon such as an octagon or a simple square.

Figure 1:
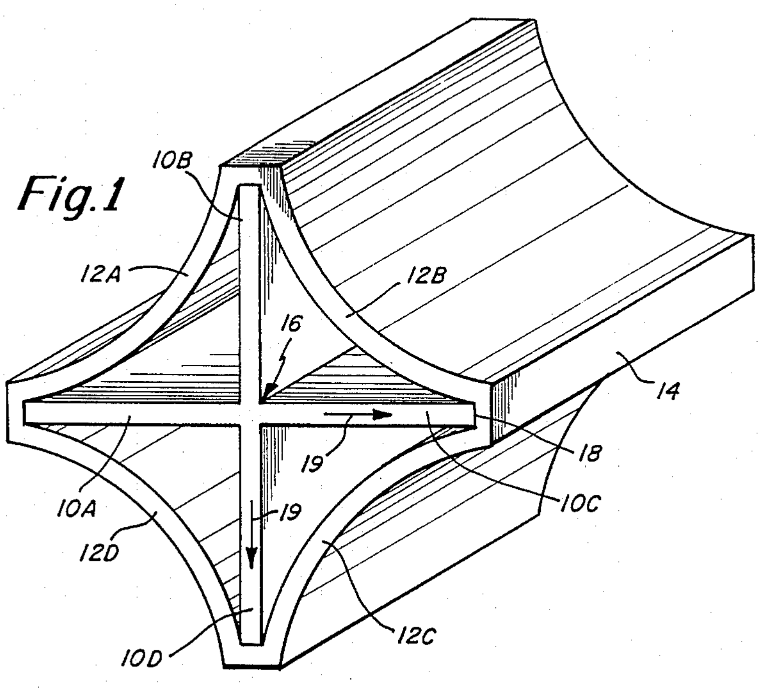
FIG. 1 is a perspective view showing the principals of the present invention as applied to a four sided astroid-shaped transducer employing piezoelectric bars inside of four curved shells interconnected at their ends.

An example of a four sided astroid shaped device is illustrated in FIG. 1. FIG. 1 illustrates a set of crossed piezoelectric ceramic bars 10A–10D driving the shells 12A–12D. Each of the shells may be made of light weight metal such as aluminum. Each of the respective shells are connected at their ends to an adjacent shell such as at the wall 14 in FIG. 1. Each of the ceramic bars extend from the center of the transducer at 16 to each of the apexes of the joined shells. In this regard note in FIG. 1 the outer end 18 of the ceramic bar 10C coupled to the apex of the shells 12B and 12C at the wall 14.

The ceramic bars 10A–10D may be operated in either the 31 or 33 mode. In the latter case a number of ceramic plates are used to comprise each bar and these plates are wired in parallel. The ceramic bars oscillate under application of an alternating voltage applied to the ceramic plates and cause the shell to move with the same frequency of oscillation. The 33 mode piezoelectric operation provides the greatest coupling coefficient and is the preferred mode of operation herein.

In the embodiment of FIG. 1, as the bars 10A–10D expand outwardly such as in the direction of the arrow 19, the ends of the curved path of the shells 12A–12D also move outward in the same direction as the drivers causing the curved part to bend outward with a magnified motion. The total outward motion is the resultant sum which is greater than either motion alone. In some applications the two ends of the transducer may be covered by a mechanically isolated and decoupled plate to prevent the inner out-of-phase radiation from interfering with the radiation from the outer part of the shell, and to prevent the piezoelectric ceramic from shorting out particularly for the case of a water loading medium flooding the inside of the transducer. In this case the inner part could be filled with a complimant oil or gas such as air.

Figure 2:
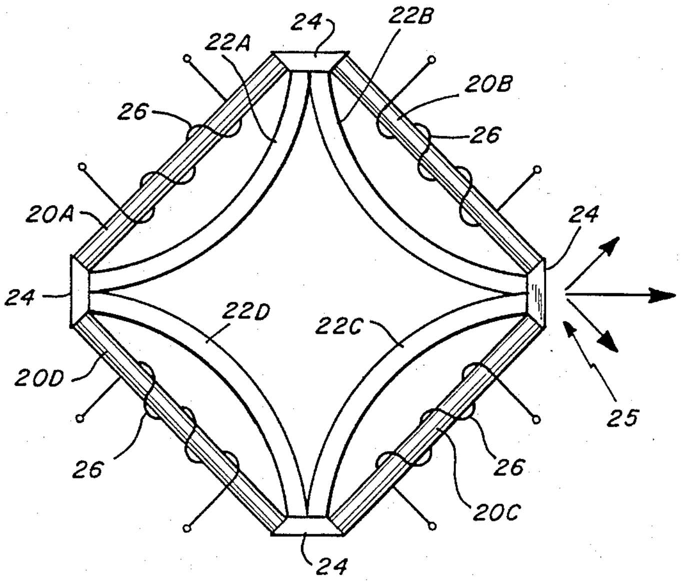
FIG. 2 schematically illustrates alternative embodiment of the present invention employing magnetostrictive rods or bars for driving the apexes of the shell from the outside and energized through coils surrounding these magnetostrictive rods or bars.

Reference is now made to FIG. 2 which schematically illustrates an alternate drive configuration. In FIG. 2 there is provided magnetostrictive rods 20A–20D for driving the associated shells 22A–22D. The shells 22A–22D may be of a light weight metal such as aluminum. In place of the magnetostrictive rods one may employ magnetostrictive bars, plates or some type of lamination of magnetostrictive or piezoelectric elements.

In FIG. 2 it is noted that there is provided at the corners of the transducers securing means illustrated at 24. This securing means ties the apexes of the shells together and likewise joins adjacent ends of the magnetostrictive rods. The magnetostrictive rods drive the apexes of the shells from the outside. Each of the magnetostrictive rods are energized through an energizing coil 26. Each coil surrounds the corresponding magnetostrictive rod as illustrated in FIG. 2.

The embodiment of FIG. 2 is a practical arrangement for underwater sound applications because the coils and connections may be easily made watertight and also because the required voltages for magnetostrictive devices are generally low because of their low impedance. In this configuration an additional benefit results from the cooling properties of the surrounding fluid allowing greater sustained power operation for the magnetostrictive rods.

The magnetostrictive composition may be the more conventional nickel or the new rare earth composition $Tb_{0.3}Dy_{0.7}Fe_2$ (Terfenol) or the metallic glass composition $Fe_{81}B_{13.5}Si_{3.5}C_{2.0}$ which have greater coupling coefficients than the piezoelectric ceramics and in the case of Terfenol have significantly greater output potential. Piezoelectric ceramic drivers may also be used if suitably insulated from the water.

In operation the rods (20A–20D) of FIG. 2 on expansion, push against each other and cause a total outward expansion of the square configuration. Now, according to the resultant vector as shown on one apex at 25, the result is equivalent to the forces which could be generated by a rod set as in FIG. 1. In the case of FIG. 2 the four rods approximate a ring structure and expand outward as the rods expand with this outward expansion causing the curved plates (22A–22D) to also move outward and thus act as radiation pistons for the structure. In addition to this the plates are bent in their flextensional mode and consequently also move outward with a magnified motion from the rod extensions (at 24) producing a large total displacement. Because of the comparatively high-compliance curved plates, they do not appreciably inhibit the motion of the rods. On contraction of the rods all parts will move inward, again resulting in a large total displacement.

Figure 2A:
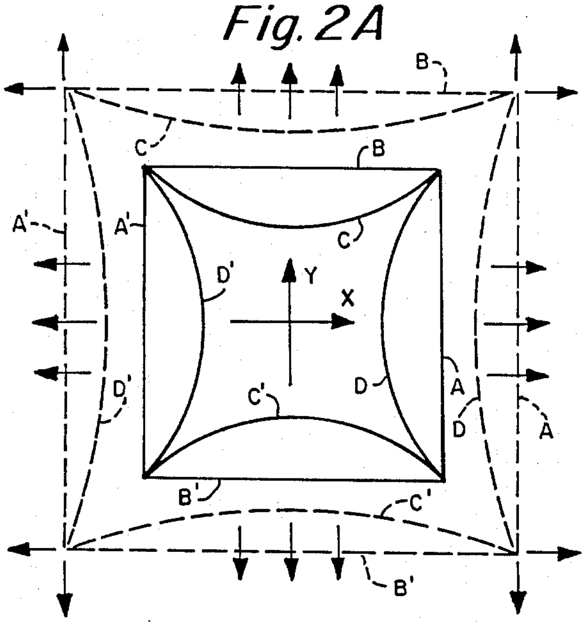
FIG. 2A is a schematic diagram illustrating the magnifying motion principals of the present invention as applied to a substantially square transducer.

A schematic outline representation of FIG. 2 is shown in FIG. 2A where the initial state is illustrated by the solid lines while the state one quarter cycle later is shown by the dashed lines. Here we see the (exaggerated) increased size of the rod geometry as it pulls the shell outward and, through the lengthwise extension of the rods, also causes the curved shell to undergo a flextensional motion resulting in outward amplified bending motion in the same direction that the shell is moving in translation. Thus, the shell undergoes both bending and translational motion in the same direction yielding greater displacements and greater acoustic output.

The mechanism for the additive motion may also be understood by considering pairs of driving rods and their additive affect on the motion of the shell segments. Thus, in FIG. 2A the expansion motion of rods A and A′ along the Y axis causes the shells C and C′ (as well as the rods B and B′) to move along the Y axis. Simultaneously with this motion the expansion of the rods B and B′ along the X axis cause the shells C and C′ to bend outward along the Y axis and add to the motion induced by the rods A and A′. The motion in the X direction may be explained by the same reasoning. Here the expansion of the rods B and B′ cause the shells D and D′ to move with translation along the X axis and the expansion of the rods A and A′ cause the same shells D and D′ to bend in the same direction along the X axis.

Figure 3:
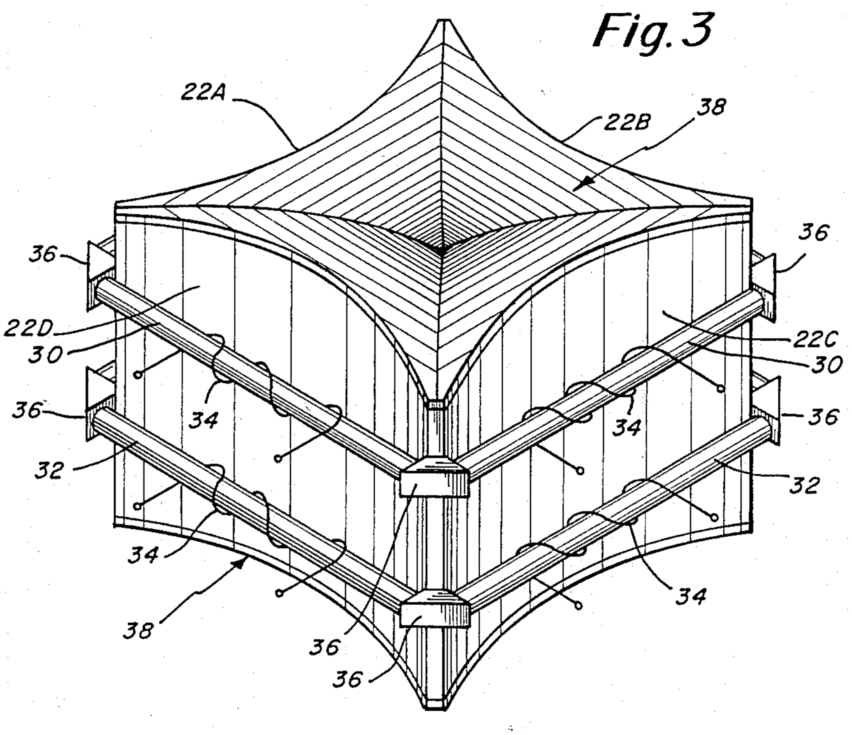
FIG. 3 is a perspective view illustrating an alternate transducer construction employing curved end plates and a double layered magnetostrictive driving system with magnetic couplers at their ends.

With reference to FIGS. 2 and 2A, in that particular structure the ends thereof may be shielded by means of an acoustically isolated thick and stiff metal plate at both ends of the structure. An alternative technique would be to use inwardly curved end plates attached directly to the apexes or possibly the radially curved plates as illustrated in FIG. 3. With this arrangement the end plates expand in phase with the radial motions producing additional acoustic output. Also illustrated in FIG. 3 is a double layered magnetostrictive driving system with magnetic couplers on their ends.

With more reference in particular to FIG. 3, it is noted that in this embodiment the construction is similar to that described in FIG. 2 employing shells 22A–22D. However, rather that using the four rods 20A–20D, there are double sets of rods such as the rods 30 in one set and the rods 32 in a lower set. Each of these rods is seperately and selectively excited by means of the coils 34 shown. FIG. 3 also shows magnetic couplers 36 at the corners of the apparatus. The magnetic couplers 36 connect together the rods to form a closed magnetic path either for each four rod set (as illustrated in FIG. 3) or for rod pairs with couplers at the corners extending from the top set to the bottom set of rods. FIG. 3 also shows the specific end construction referred to previously in the form of radially curved plates illustrated at 38.

Figure 4:
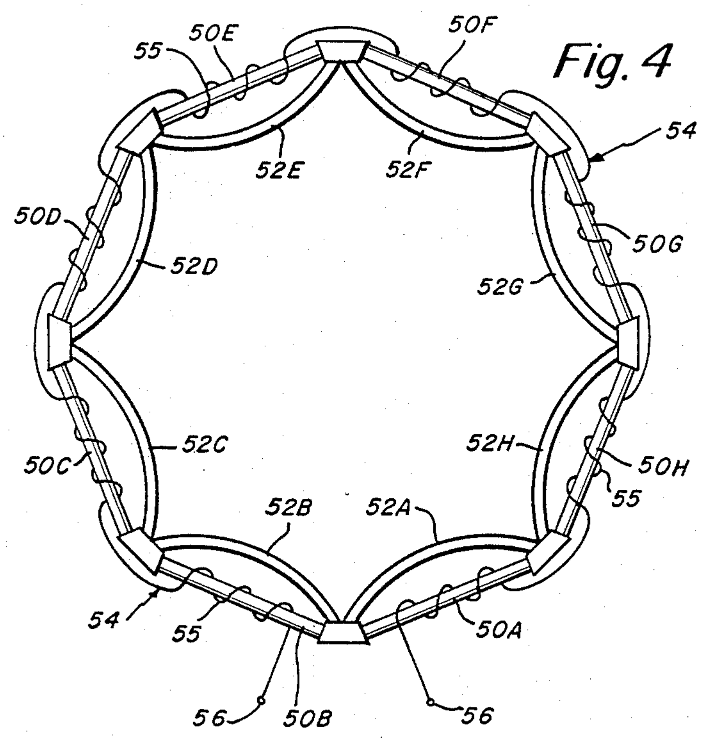
FIG. 4 illustrates an octagon shaped transducer employing magnetostrictive rods on the outside of curved shells with the rods being driven through a common drive circuit.

A more complex shape of the invention is shown in FIG. 4 where now the magnetostrictive rods (50A–50H) take on the shape of an octagon. In this latter case it is easily seen that under simultaneous expansion of the rods the polygon moves outwardly as a ring bringing along with it the curved plates (52A–52H) which move outward with both translation and bending motions. In this case the geometry of the driving system approximates a torodial magnetic circuit if magnetostrictive elements are used.

In the embodiment of FIG. 4 it is noted that the excitation circuit 54 is in the form of a series of interconnected coils 55 each associated with one of the magnetostrictive rods. This circuit is excited at the terminals of 56.

Figure 5:
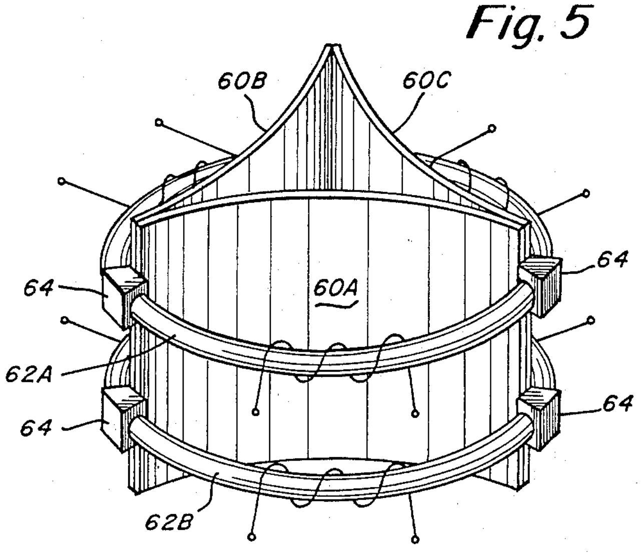
FIGS. 5 & 6 illustrate a further embodiment of the invention employing the minimum number of shells, namely three shells are driven by a pair of transducer rings.

An additional alternative to a polygon drive arrangement is to utilize a piezoelectric or magnetostrictive ring as the driving mechanism along with the various shell configurations illustrated. Thus in FIG. 4 the eight separate rods may be replaced by one or possibly two or more continuous piezoelectric or magnetostrictive rings firmly attached to the apexes and suitably electrically insulated from the water if used in underwater applications. The ring height must be short compared to the height of the curved structure so as not to block the radiation from the curved plates. FIG. 5 illustrates this drive mechanism for the case of a three sided structure driven by two rings.

Figure 6:
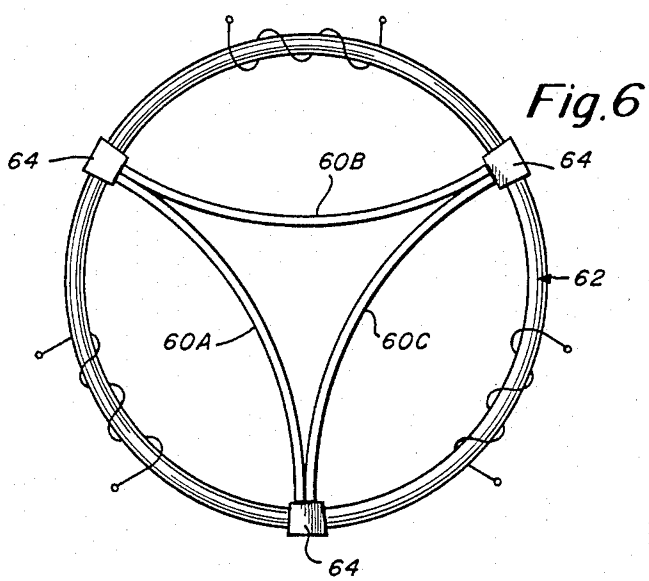

With particular reference to FIGS. 5 & 6, there is illustrated therein the minimum shell configuration employing three arched shells 60A–60C. Also illustrated is the continuous ring at 62 and illustrated in FIG. 5 as actually being formed from a pair of spaced rings 62A & 62B. As clearly illustrated in FIG. 6 each of these rings is attached at the apex of the shells illustrated at 64. Again, excitation is provided for the magnetostrictive rings.

Figure 7:
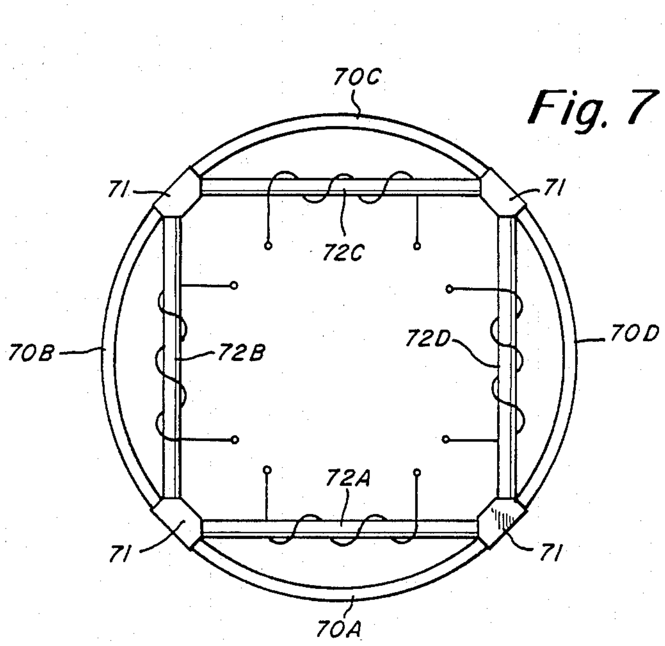
FIG. 7 schematically illustrates a further embodiment of the present invention employing four shells with associated magnetostrictive rods in which the shells are disposed externally of the rods.

FIG. 7 illustrates an alternate embodiment of the present invention that is also in the form of a square transducer. It is noted that in the embodiments of FIGS. 2–5 the magnetostrictive drive members are on the outside of the transducer structure. FIG. 7 illustrates an arrangement in which the magnetostrictive rods are disposed on the inside of the structure. In this regard note the four curved shells 70A–70D connecting at their apexes at 71 with the magnetostrictive rods 72A–72D. In this arrangement when the rods expand the shells likewise undergo both translational and bending motions as in the previous embodiments. However, here the bending and translation motion are not generally in the same direction and thus this configuration of FIG. 7 is not the preferred embodiment. In cases where the translation motion is small this arrangement may produce satisfactory output.

The design and operation of the transducer is affected by the proximity of the resonant frequency of the shell pieces as well as their combined resonance and the resonance of the polygon or ring driving elements. The resonant frequency of the curved shell pieces depends on the wall thickness of the curved shell pieces and the lengths of the major and minor axes. The resonant frequency of the polygon or ring driving system is most strongly dependent on the average diameter of the geometry. The two resonances may be operated together as a coupled system providing a smooth broadband response.

Typically the flextensional shell resonance is below the ring or polygon resonance. Here the ring motion augments the shell bending motion. On the other hand, if the shell resonance were above the ring resonance, its motion may be thought of as augmenting the motion of the ring. If closely coupled, their motions would augment each other.

The shell may be used to pre-stress the transduction drivers for high power operation by inserting the rods or bars in place while the shell is under outward radial expansion. Relaxation of the shell then puts the rods or bars into compression allowing greater strains without fracture.

The transducer may be operated in air or in water depending upon the design parameters chosen. It may also be operated in the receive as well as the transmit mode. The transducer may also be driven by a combination of magnetostrictive and piezoelectric drive elements to obtain directional or self tuned performance as described in my U.S. Pat. No. 4,443,731 "Hybrid Piezoelectric and Magnetostrictive Acoustic Wave Transducer" (Apr. 17, 1984).

In summary, the invention described herein is in the form of an acoustic transducer formed from a minimum of three curved shells which are attached to each other at their ends. The shells are driven by a transduction mechanism which is attached to the apexes of the shells. The shell is preferably curved inward so that as it moves outward in a radial direction the shell also bends outward in the radial direction yielding improved performance with the added displacement which is particularly important at low operating frequencies. The shell may be driven by a polygon or ring shaped transduction mechanism preferably surrounding and attached to the apexes of the shell. The shell may also be driven from within the shell by transducer bars or rods attached to the apexes of the curved shell. The inside of the shell may be shielded and only the outside radiation utilized or vice versa, or in combination. Electrostrictive (piezoelectric) and magnetostrictive transduction may be used to drive the shell. The resonances of the shell and the ring system may be brought close together to yield a broad-band smooth response. The shell flextensional response may also be used to enhance the output of a ring type transducer.

Having now described the limited number of embodiments of the present invention, it should now be apparent those skilled in the art that numerous other embodiments and modifications thereof are contemplated as falling within the scope of the present invention as defined by the appended claims.

What is claimed is:

1. A flextensional polygon transducer comprising, a hollow resilient housing including at the least three inwardly curved shells each having opposite ends, a transduction drive means including at the least three drive members each having opposite ends, means commonly securing ends of the drive members to ends of each of the curved shells at at least three connection points corresponding to said at least three shells and drive members, and means for exciting said transduction drive means to cause the curved shells to move additively with both translational and bending motions in the same direction to enhance acoustic output, said curved shells being disposed inside of the transduction drive means.

2. A flextensional transducer as set forth in claim 1 wherein the hollow resilient housing is comprised of four shells and the transduction drive means comprises four corresponding drive members arranged in a substantially square transducer construction.

3. A flextensional transducer as set forth in claim 1 wherein the hollow resilient housing comprises eight curved shells and the transduction drive means comprises eight drive members.

4. A flextensional transducer as set forth in claim 1 wherein said transduction drive means comprises a magnetostrictive ring.

5. A flextensional transducer as set forth in claim 1 wherein said transduction drive means comprises an electrostrictive ring.

6. A flextensional transducer as set forth in claim 1 wherein the transduction drive means includes separate first and second transduction members, each including at least three drive members.

7. A flextensional transducer as set forth in claim 6 wherein said drive members each comprise one of a magnetostrictive means and electrostrictive means.

8. A flextensional transducer as set forth in claim 1 wherein said transduction drive means comprises one of a magnetostrictive ring and electrostrictive ring, said ring adapted to be secured to the connected ends of the curved shells.

9. A flextensional transducer as set forth in claim 1 wherein said means for exciting excites only said transduction drive means.

10. A flextensional transducer as set forth in claim 1 including four curved shells all curved inwardly and wherein said transduction drive means comprises four corresponding drive members disposed in a cross-shaped configuration inside of the curved shells.

11. A flextensional transducer as set forth in claim 10 wherein each of the drive members comprises a piezoelectric bar.

12. A flextensional transducer as set forth in claim 11 wherein the piezoelectric bar is comprised of multiple piezoelectrical plates.

13. A flextensional transducer as set forth in claim 1 wherein said housing is metallic.

14. A flextensional transducer as set forth in claim 13 wherein said housing is aluminum.

15. A flextensional transducer as set forth in claim 1 wherein said shells are constructed of a material responsive only to forces imposed thereon by the drive members to induce thereon both translational and bending motion.

16. A flextensional transducer as set forth in claim 15 wherein said shells are constructed of non-magnetostrictive material.

17. A flextensional transducer as set forth in claim 16 wherein said shells are constructed of non-electrostrictive material.

18. A flextensional polygon transducer comprising, a hollow resilient housing including at the least three inwardly curved shells each having opposite ends, a transduction drive means including at the least three drive members each having opposite ends, means commonly securing ends of the drive members to ends of each of the curved shells at at least three connection points corresponding to said at least three shells and drive members, and means for exciting said transduction drive means to cause the curved shells to move additively with both translational and bending motions in the same direction to enhance acoustic output, wherein there are included four curved shells and four corresponding drive members with the drive members disposed outside of the shells and each drive member connected at their ends to the end of a corresponding shell.

19. A flextensional transducer as set forth in claim 18 wherein said means for exciting includes a coil means for separately driving each of the drive members.

20. A flextensional transducer as set forth in claim 19 wherein each of the drive members is comprised of one of a magnetostrictive means and electrostrictive means.

* * * * *